(12) United States Patent
Gong et al.

(10) Patent No.: US 9,673,150 B2
(45) Date of Patent: Jun. 6, 2017

(54) EMI/RFI SHIELDING FOR SEMICONDUCTOR DEVICE PACKAGES

(71) Applicants: Zhiwei Gong, Chandler, AZ (US);
Scott M. Hayes, Chandler, AZ (US);
Michael B. Vincent, Chandler, AZ (US)

(72) Inventors: Zhiwei Gong, Chandler, AZ (US);
Scott M. Hayes, Chandler, AZ (US);
Michael B. Vincent, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/571,878

(22) Filed: Dec. 16, 2014

(65) Prior Publication Data
US 2016/0172309 A1    Jun. 16, 2016

(51) Int. Cl.
| H01L 23/34 | (2006.01) |
| H01L 23/552 | (2006.01) |
| H01L 23/495 | (2006.01) |
| H01L 23/31 | (2006.01) |
| H01L 21/56 | (2006.01) |
| H01L 21/78 | (2006.01) |

(Continued)

(52) U.S. Cl.
CPC ........ *H01L 23/552* (2013.01); *H01L 21/3205* (2013.01); *H01L 21/561* (2013.01); *H01L 21/78* (2013.01); *H01L 23/3114* (2013.01); *H01L 23/49524* (2013.01); *H01L 23/49541* (2013.01); *H01L 24/96* (2013.01); *H01L 24/97* (2013.01); *H01L 21/568* (2013.01); *H01L 23/49827* (2013.01); *H01L 24/32* (2013.01); *H01L 24/48* (2013.01); *H01L 24/73* (2013.01); *H01L 24/92* (2013.01); *H01L 2224/04042* (2013.01); *H01L 2224/04105* (2013.01); *H01L 2224/05554* (2013.01); *H01L 2224/12105* (2013.01); *H01L 2224/32225* (2013.01); *H01L 2224/32245* (2013.01); *H01L 2224/48091* (2013.01); *H01L 2224/48227* (2013.01); *H01L 2224/48247* (2013.01); *H01L 2224/49109* (2013.01); *H01L 2224/73265* (2013.01); *H01L 2224/92247* (2013.01); *H01L 2224/97* (2013.01); *H01L 2924/00014* (2013.01); *H01L 2924/15311* (2013.01); *H01L 2924/181* (2013.01); *H01L 2924/19105* (2013.01); *H01L 2924/19107* (2013.01); *H01L 2924/3025* (2013.01)

(58) Field of Classification Search
CPC ....... H01L 21/32139; H01L 2224/1147; H01L 23/5384; H01L 23/562; H01L 24/03; H01L 51/56; H01L 23/552; H01L 21/3205; H01L 21/561; H01L 21/78; H01L 23/3114; H01L 23/49541; H01L 24/48; H01L 24/96; H01L 2224/48247; H01L 2924/15311; H01L 2924/3025
USPC ......................................... 257/719
See application file for complete search history.

(56) References Cited

U.S. PATENT DOCUMENTS 7,030,469 B2 *  4/2006  Mahadevan et al. ......... 257/659
7,187,060 B2 *  3/2007  Usui ................ H01L 23/49822
                                                        257/659

(Continued)

*Primary Examiner* — Tod T Van Roy
*Assistant Examiner* — Vu A Vu

(57) ABSTRACT

An encapsulated semiconductor device package with an overlying conductive EMI or RFI shield in contact with an end of a grounded conductive component at a lateral side of the package, and methods of making the semiconductor device package.

18 Claims, 9 Drawing Sheets

(51) Int. Cl.
*H01L 21/3205* (2006.01)
*H01L 23/00* (2006.01)
*H01L 23/498* (2006.01)

(56) References Cited

U.S. PATENT DOCUMENTS

| | | | |
|---|---|---|---|
| 7,880,193 B2* | 2/2011 | Lam | H01L 21/561 |
| | | | 257/106 |
| 8,018,033 B2* | 9/2011 | Moriya | H01L 23/29 |
| | | | 257/659 |
| 8,084,300 B1* | 12/2011 | San Antonio | H01L 21/561 |
| | | | 257/E21.602 |
| 9,236,356 B2* | 1/2016 | Yang | H01L 23/60 |
| 2009/0201268 A1* | 8/2009 | Endo et al. | 345/174 |
| 2009/0294928 A1 | 12/2009 | Kim et al. | |
| 2010/0072582 A1 | 3/2010 | Chandra et al. | |
| 2010/0207258 A1 | 8/2010 | Eun et al. | |
| 2011/0115060 A1 | 5/2011 | Chiu et al. | |
| 2012/0025356 A1* | 2/2012 | Liao | H01L 23/3121 |
| | | | 257/659 |
| 2012/0052630 A1* | 3/2012 | Lin et al. | 438/108 |
| 2012/0104574 A1 | 5/2012 | Boeck et al. | |
| 2013/0082364 A1* | 4/2013 | Wang | H01L 23/3128 |
| | | | 257/659 |

* cited by examiner

US 9,673,150 B2

EMI/RFI SHIELDING FOR SEMICONDUCTOR DEVICE PACKAGES

FIELD OF THE INVENTION

The present invention relates generally to semiconductor device packages, and more particularly to semiconductor device packages with shielding against electromagnetic (EM) and/or radio frequency (RF) interference, and methods for forming the devices and packages.

BACKGROUND OF THE INVENTION

As semiconductor devices continue to decrease in size and increase in density, a primary challenge relates to reduction of electromagnetic (EM) and radio frequency (RF) interference, or other inter-device interference which can adversely affect the operation and performance of neighboring devices. EM and RF interference is the undesired electrical or radio signals or noise in the electronic system circuitry of a device caused by the unintentional coupling of EM or RF field energy from external sources. Such external sources include, for example, wires, printed circuit board conductors, connector elements and pins, cables, and other circuitry of nearby devices.

For semiconductor packages used in wireless systems, a shield may be used to protect the electronics of the device from unintended EM or RF energy. The shield also functions to prevent unintended radiation of EM energy from the electronics of the device to other circuitry.

Various attempts have been made to shield semiconductor packages from undesirable EM or RF interferences by applying a shielding layer over the encapsulated device package with the shielding layer connected to ground using a grounding wire or external connection. However, such techniques increase the cost and complexity of the packaging process. In addition, there is no known shielding technique that can be applied universally to a variety of device package types, and that is also reliable and cost effective.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale.

DETAILED DESCRIPTION

Figure 1:
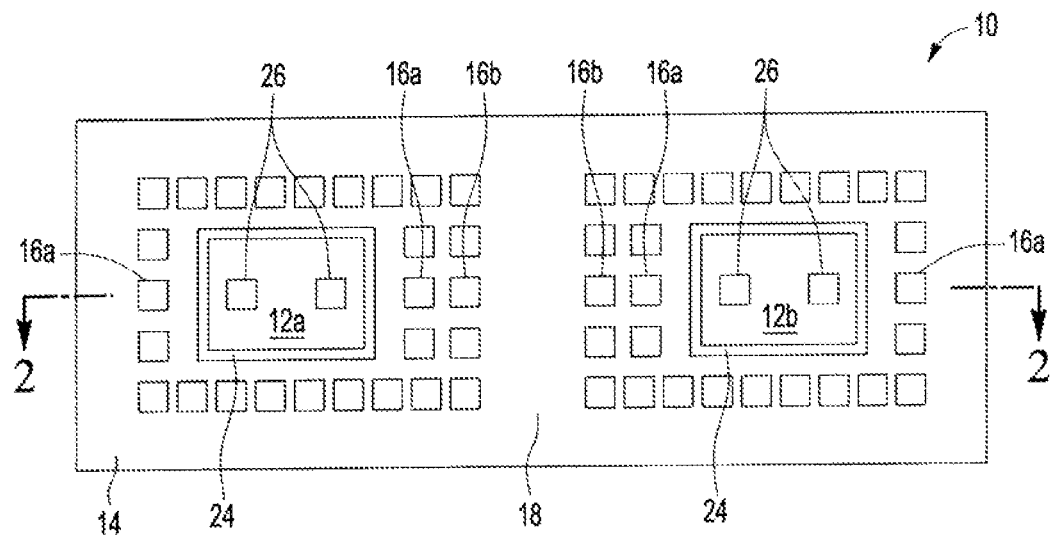
FIG. 1 is a plan view of a partially-completed semiconductor device panel according to an embodiment of the invention, showing semiconductor dies mounted on a substrate panel.

Embodiments of the invention generally include semiconductor devices, packaged devices, and methods for forming the devices and packages. The device packages are structured with a conductive shield layer on the top and sides (e.g., side of mold compound) of the encapsulated device package, with the shield electrically connected to a grounded conductive component at a side of the package. As used herein, reference to the "top" of a die refers to a surface of a die that is oriented away from a substrate to which the die may be coupled, where the surface of the die that is oriented toward the substrate may be referred to as the "bottom" of the die. Similarly, reference to the "top" of a device package refers to a surface of the device package that is opposite the surface to which the device package will be coupled to another substrate (e.g., a printed circuit board (PCB)), where the surface of the device package that is coupled to the other substrate (e.g., the surface at which conductive balls are attached) is referred to as the "bottom" of the device package. Reference to "sides" of a die or device package refers to surfaces of the die or device package extending between the top and bottom surfaces.

The description and Figures convey a process for forming multiple packaged semiconductor devices by attaching multiple die and conductive components to multiple "package areas" on a common substrate (e.g., a BGA substrate), where a "package area" is a portion of the common substrate corresponding to a single packaged device, once the substrate is singulated. For example, multiple package areas may be arranged in a strip (e.g., the multiple package areas may be arranged in a 1×N strip, where N corresponds to the number of package areas, and N total packaged devices can be simultaneously fabricated), or in an array (e.g., the multiple package areas may be arranged in an A×B array, where A is the number of rows of package areas, and B is the number of columns of package areas, and the total number of packaged devices that can be simultaneously fabricated is equal to A times B). In the Figures, the illustrated embodiments show portions of an array or strip that include two adjacent package areas to which two die and a conductive component are coupled to a common substrate (or "substrate panel", such as a BGA strip, array, or panel). The die and the conductive component are then encapsulated to complete a device panel, and a singulation process is performed through a "saw street" that extends through the encapsulant, conductive component, and substrate. The singulation process separates the device panel into two packaged semiconductor devices. More specifically, a first die is coupled to a first package area on a top surface of the substrate, a second die is coupled to a second package area on the top surface of the substrate, and the conductive component is coupled to the top surface of the device substrate so that the conductive component spans from the first package area across to the second package area. Those of skill in the art would understand that the process may be extended to fabricating more than two packaged semiconductor devices (e.g., by attaching more than two die to a common substrate with more than two package areas, such as a strip or array of package areas, encapsulating the die, and performing a singulation process to separate the package areas). Further, in theory, embodiments of methods for forming packaged semiconductor devices could be formed one device at a time.

In any event, the singulation process defines individual encapsulated device packages, and as will be explained in more detail below, exposes the conductive component at a sidewall of the singulated device. More specifically, prior to singulation, the conductive component spans the space between the device areas through which the singulation process is performed (e.g., the "saw street"). After singulation, the conductive component is exposed at a sidewall of the encapsulated and singulated device package, and a shielding layer subsequently is coupled directly to the exposed portion of the conductive component. The shielding layer and conductive component can be coupled to ground (or to another voltage reference) when the device package is incorporated into a larger electrical system. The conductive component can be incorporated into and adapted for use in a variety of device package types (e.g., ball grid array (BOA) packages (including wire-bonded molded array process BGA (MAPBGA) packages) fan out wafer level packages (FO-WLP), and flat no-leads (e.g., QFN and DFN) device packages, to name a few). Embodiments of the invention may provide a cost effective device package with an integrated and reliable EMI and/or RFI shield. Further limitations and disadvantages of conventional processes and technologies will become apparent to one of skill in the art after reviewing the remainder of the present application with reference to the drawings and detailed description which follow.

Figure 2:
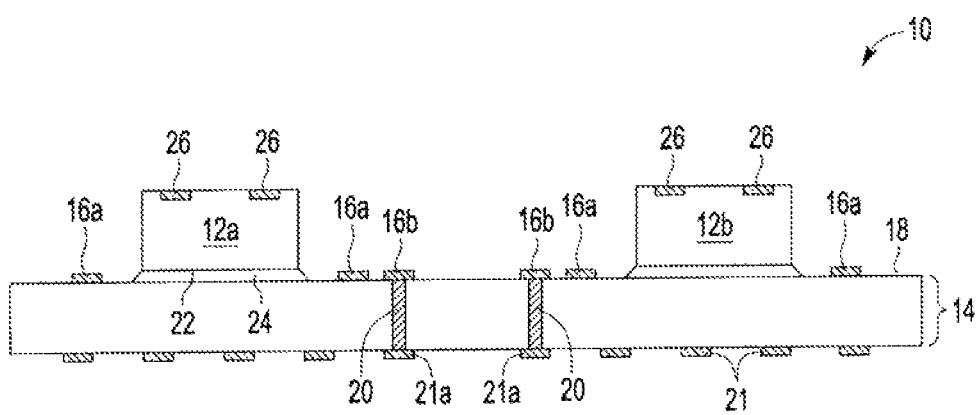
FIG. 2 is a cross-sectional, side view of the semiconductor device panel of FIG. 1, taken along line 2-2.

FIGS. 1 to 13 illustrate plan and cross-sectional side views of a semiconductor device panel at various stages of manufacture. The illustrated embodiments correspond to formation of encapsulated semiconductor device packages in the form of MAPBGA packages, which are enclosed with EMI or RFI shielding according to various embodiments of the invention. FIGS. 1-2 illustrate plan and cross-sectional, side views of an embodiment of a partially-formed semiconductor device panel 10 at a stage at which a plurality of semiconductor dies 12a, 12b have been mounted on a substrate panel 14 in two adjacent package areas. In the illustrated embodiment, the substrate panel 14 includes a single layer of dielectric material, two conductive layers at top and bottom surfaces of the dielectric material layer, and conductive structures (e.g., vias) that extend through the dielectric material layer and establish electrical connections between conductive elements of the conductive layers through the dielectric material. In an alternate embodiment, the substrate 14 may be a multi-layer laminate substrate panel, with one or more additional conductive layers embedded within dielectric material layers. The substrate panel 14 shown in FIGS. 1-8 supports a plurality of dies, and the substrate panel will be encapsulated and singulated into individual device packages at a later process step. Typically, one conductive layer (e.g., a top layer, from the perspective of FIG. 2) of the substrate panel further includes electrically conductive traces, and another conductive layer (e.g., a bottom layer, from the perspective of FIG. 2) includes contact pads on which external contacts (e.g., solder bumps) are attached for connection of the individual encapsulated device packages to a PCB or other external circuitry.

As shown, the substrate panel 14 includes one or more contact pads 16a, 16b formed from a first conductive layer at a first (e.g., top) surface 18 of the substrate panel 14. Although not shown in FIG. 1 or 2, a solder resist layer may be formed over the first conductive layer, where openings in the solder resist layer may expose the contact pads 16a, 16b. Accordingly, reference to a contact pad being "at" or "on" a surface of the substrate panel 14 means that the contact pad may be formed from a conductive layer that overlies the surface of the substrate panel 14, or the contact pad may be exposed (e.g., through openings in a solder resist layer) at the surface of the substrate panel 14. Although FIG. 2 shows vias 20 that are directly aligned with contact pads 16b for purpose of ease of illustration, in actuality the vias 20 and contact pads 16b may not be directly aligned with each other, but rather may be offset from each other. For example, the contact pads 16a, 16b may be electrically connected to one or more conductive signal traces (not shown) formed on the surface 18 and/or within layers (not shown) of the substrate panel 14. Both the contact pads 16a, 16b and traces can be formed using conventional substrate manufacturing processing, for example, by photo masking, etching and/or an electrolytic or electroless plating process. In various embodiments, the contact pads 6a, 16b can be formed from copper (Cu), titanium (Ti), nickel (Ni), gold (Au), silver (Ag), other metals, a metal alloy, a conductive polymer, or another suitable electrically conductive material. In an embodiment, the contact pads are formed from copper (Cu) with nickel gold (NiAu) plating.

Figure 6:
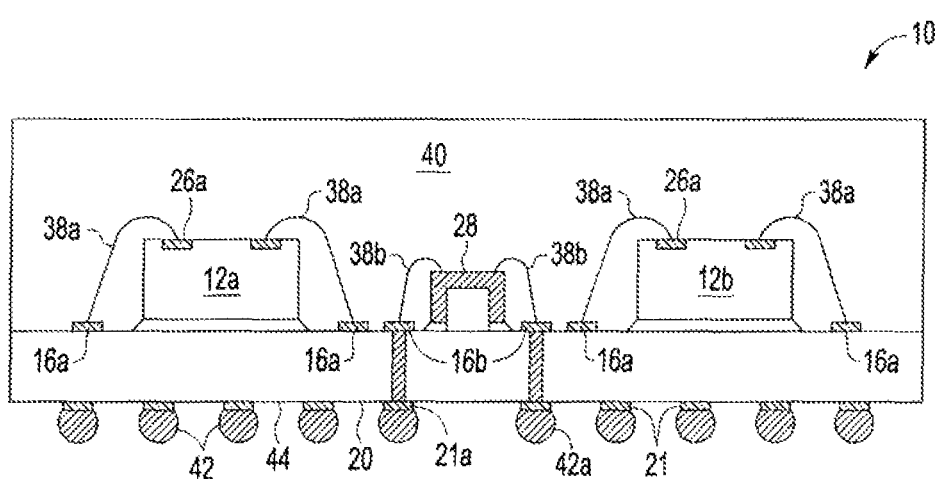
FIG. 6 is a cross-sectional, side view of the semiconductor device panel of FIG. 5, at a subsequent process step showing encapsulation of the dies and conductive component.
Figure 7:
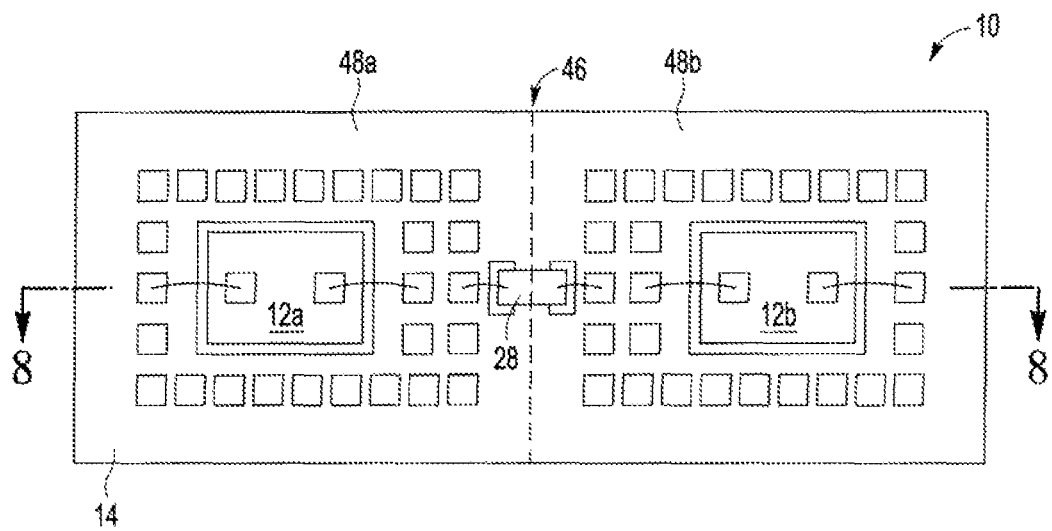
FIG. 7 is a plan view of the semiconductor device panel of FIG. 5, at a subsequent process step showing a saw street.

One of the substrate contact pads 16a, 16b is a ground contact pad (here 16b), which may be electrically connected to a ground electrical contact (e.g., through a solder bump) or other grounding element when the device is incorporated into a larger electrical system. In the embodiment illustrated in FIG. 2, contact pad 16b may be connected to ground, as for example, through an electrical interconnect 20 (e.g., a conductive via) through the substrate panel 14, to a contact pad 21a on which a solder bump (42a; FIG. 6) can be attached. In the embodiment depicted in FIGS. 1 and 2, the bottom surfaces 22 of dies 12a, 12b are mounted on the surface 18 of the substrate panel 14 using adhesive (e.g., epoxy, polymer composite), solder, sinterable ink, or other bonding material 24. The dies 12*a*, 12*b* have contact pads 26 on their top surfaces, which are electrically connected to circuit elements formed within the die. In an alternate embodiment, the dies 12*a*, 12*b* may be flip-chip mounted to the top surface 18 of the substrate panel 14. More specifically, the dies 12*a*, 12*b* may have contact pads on their bottom surface, and those contact pads may be coupled to corresponding contact pads on the top surface 18 of the substrate panel 14. In such an embodiment, translation of the pitch of the die contact pads may be made using traces on or within the substrate panel 14. The contact pads 26 can be a metal, a metal alloy, a conductive polymer, or another suitable electrically conductive material.

Figure 3:
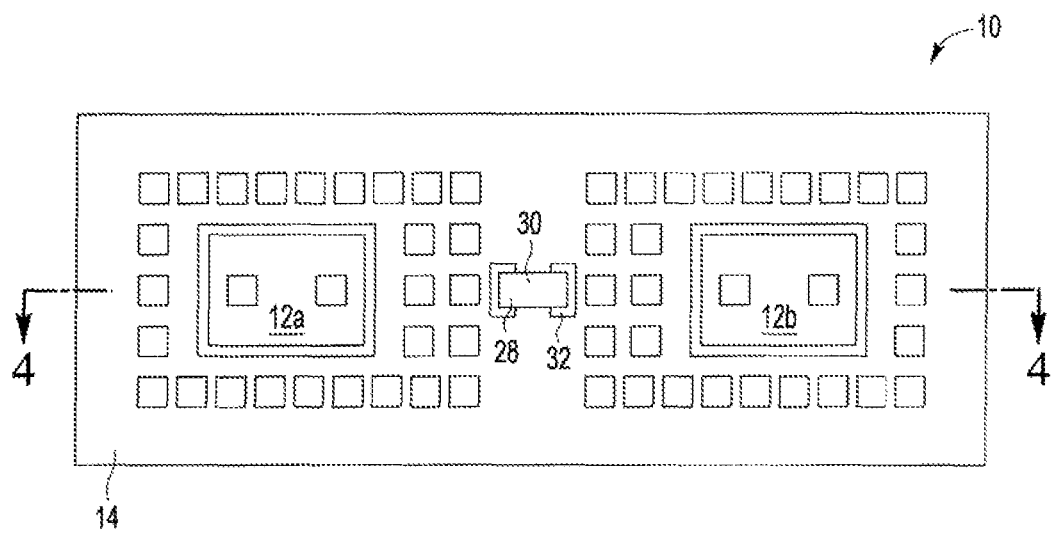
FIG. 3 is a plan view of the semiconductor device panel of FIG. 1, at a subsequent process step showing a conductive component mounted on the substrate panel.
Figure 4:
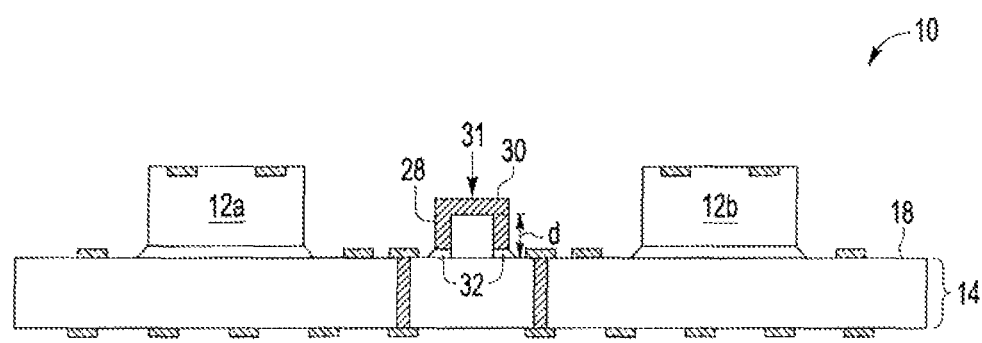
FIG. 4 is a cross-sectional, side view of the semiconductor device panel of FIG. 3, taken along line 4-4.

Referring now to FIGS. 3-4, according to an embodiment of the invention, a conductive component 28 is coupled to the substrate 14 between dies 12*a*, 12*b* of adjacent devices (e.g., spanning the "saw street" between the devices). As will be explained in more detail later, the conductive component 28 will provide an electrically conductive contact at the sidewall of each singulated, encapsulated device package. The conductive component 28 can be a metal (e.g., Al, Cu, Ti, Sn, Ni, Au, Ag), a metal alloy, a conductive polymer, or another suitable electrically conductive material. According to an embodiment, the conductive component 28 is a rigid conductive structure (e.g., a conductive "link"), which is pre-formed prior to attachment to the substrate 14. Alternatively, the conductive component can also be a multi-layered element. In still other embodiments, the conductive component 28 may be formed in-situ on the surface of the substrate 14.

The conductive component 28 is designed and structured with a bridging section 30 that extends between the package areas to which the two dies 12*a*, 12*b* are coupled. In an embodiment, the bridging section 30 can be elevated above or distanced from (by a distance "d") the surface of the substrate panel 14. In an embodiment, the conductive component 28 has an arch configuration as shown in FIGS. 3-4. This enables the bridging section 30 to be elevated above the conductive layer at the top surface 18 of the substrate panel 14. For example, in some cases, the conductive layer at the top surface 18 of the substrate panel 14 may have a plating bus or other conductive feature at the edge of the package area, and elevating the bridging section 30 above such a conductive feature facilitates later formation of a conformal shield 54 (FIG. 10) that contacts only the conductive component 28 (and not the plating bus or other feature). In an alternate embodiment, the conductive component may be in the form of a block that contacts the top surface of the substrate panel 14 across an entire width of the conductive component (i.e., the conductive component does not include a bridging section that is elevated above the surface of the substrate panel 14).

In a subsequent singulation of the encapsulated dies (e.g., as will be discussed in conjunction with FIGS. 7-9), the bridging section 30 is cut at or about central section 31 (FIG. 4). The cut end of the bridging section 30 is thus exposed at a lateral side of the singulated package. As will be explained in conjunction with FIGS. 10 and 11, later, a shielding layer is then applied over the package including the exposed cut end of the bridging section 30 of the conductive component 28. Structuring the bridging section 30 of the conductive component with an arched section or the like that is distanced (e.g., by distance d) from the surface 18 of the substrate panel 14, as depicted in FIG. 4 allows the shielding layer to be applied to the exposed end of the conductive component and yet spaced apart from the surface 18 of the substrate panel 14 to avoid shorting of the conductive component 28 and the shielding layer itself to the conductive layer at the surface 18 of the substrate panel 14. In embodiments, the distance (d) between the surface 18 of the substrate panel 14 and the bridging section 30 can range from about 5 microns to about 250 microns. Alternatively, the distance can range from about 50 microns to about 100 microns. In other embodiments, the distance may be greater than 250 microns.

In an embodiment, the conductive component 28 can be a pre-formed element that is mounted on the substrate panel 14, for example, using adhesive or other bonding material 32, as shown in FIGS. 3-4. The conductive component 28 can be pre-formed by a conventional process such as, for example, injection molding, casting, machining, punch pressing, roll forming, stamping, blow molding, compression molding, extrusion molding, transfer molding, thermoforming, substantive etching or additive printing, among other processes.

The conductive component 28 can also be formed on the substrate panel in-situ prior to or after attachment of the dies 12*a*, 12*b* onto the substrate 14. For example, the conductive component 28 can be fabricated on the substrate by multiple iterations of a deposition process, an electroplating process, a lamination technique, or a printing process such as an additive printing process, or by an additive or subtractive process in which one or more thick conductive layers are deposited to form the conductive component 28. Other processes also could be used to form conductive component 28 in-situ.

Figure 10:
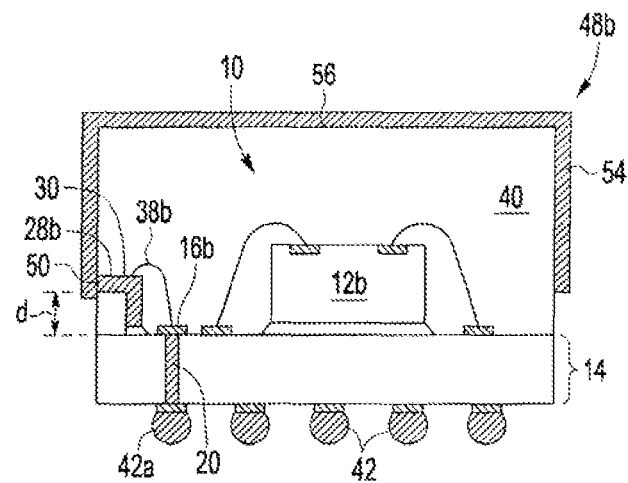
FIG. 10 is a cross-sectional, side view of a singulated encapsulated device package of FIG. 9, at a subsequent process step showing application of a conductive shielding layer over the package.

The conductive component 28 is generally sized and shaped to fit on the substrate panel between dies of two adjacent package areas, e.g., between dies 12*a*, 12*h*. For illustrative purposes, the conductive component 28 can be dimensioned, for example, with a width (w) of about 25-500 microns and a length (l) of about 300-5000 microns. In other embodiments, the dimensions of the conductive component may be larger or smaller than the above-given dimensions. In any event, according to an embodiment, the cross-sectional area of the bridging section 30 is in a range of about $0.002 \text{ mm}^2$ to about $50 \text{ mm}^2$. The cross-sectional area of the bridging section 30 corresponds to the area of the conductive component 28 that later will be coupled to conformal shield 54 (FIG. 10). Such a cross-sectional area is sufficient to ensure good electrical contact with the conformal shield 54, once it is applied to the device (e.g., as shown in FIG. 10). In other embodiments, the cross-sectional area of the bridging section 30 may be larger or smaller than the above-given range.

Figure 5:
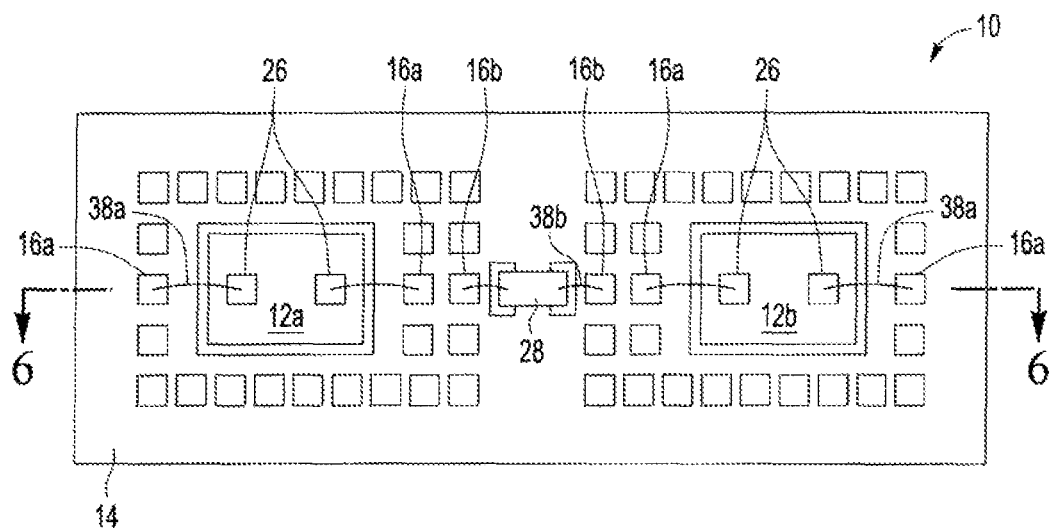
FIG. 5 is a plan view of the semiconductor device panel of FIG. 3, at a subsequent process step showing wirebonding of the dies and conductive component.

Referring now to FIGS. 5 and 6, dies 12*a*, 12*b* are wirebonded to contact pads 16*a*, and the conductive component 28 is wire bonded to contact pads 16*b*. For example, as illustrated, the contact pads 26 of dies 12*a*, 12*b* can be electrically coupled to contact pads 16*a* on the substrate panel 14 by bonding wires 38*a* (only one of which is shown, although there may be multiple bonding wires interconnecting other contact pads of dies 12*a*, 12*b* to other contact pads 16*a* on the substrate panel 14). Similarly, the conductive component 28 can be connected by bonding wires 38*b* to the ground contact pads 16*b* (only one of which is shown, although there may be multiple bonding wires coupling the conductive component 28 to one or more ground contact pads 16*b*).

As shown in FIG. 6, an encapsulation process can then be performed to cover the dies 12*a*, 12*b* and the conductive component 28 with a molding compound or encapsulant 40. The molding compound is then set or cured to a solid phase. The molding compound is non-conductive and can be made, for example, of a silica filled thermosetting epoxy resin, for example, a novolac epoxy resin-based compound or other polymer material, which produces a rigid plastic body surrounding the dies 12a, 12b and the conductive component 28. Encapsulation of the dies can be conducted, for example, by transfer molding, stencil printing, compression molding, and the like.

Figure 8:
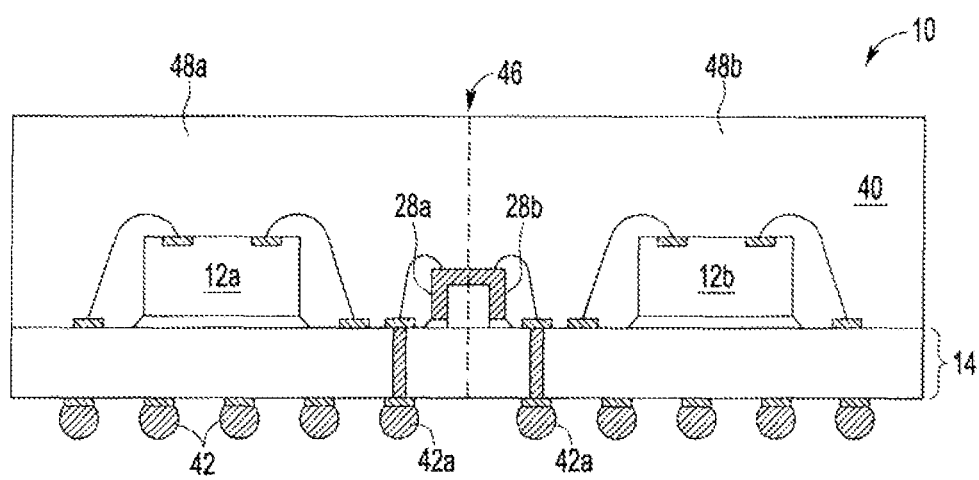
FIG. 8 is a cross-sectional, elevational view of the semiconductor device panel of FIG. 7, taken along line 8-8.

External contacts 42, 42a (e.g., solder ball contacts or bumps) can then be attached to ball pads 21, 21a exposed on the bottom (second) surface 44 of the substrate panel 14, as also shown in FIG. 8. The external contacts 42, 42a are later used in connecting the singulated, encapsulated device packages as a component to an external electrical circuit or device (e.g., PCB). External contacts 42, 42a can be formed of an electrically conductive solder material, other metal, alloy or suitable conductive materials. External contacts 42, 42a can be attached using conventional semiconductor assembly processes and equipment. For example, the contacts 42, 42a can be attached by applying and reflowing a solder material to bond the contacts 42, 42a to the ball pads 21, 21a on the substrate panel 14. External contacts 42, 42a can also be formed on the substrate panel by conventional processes such as, for example, stenciling, screen printing, electroplating, electroless plating, evaporation, and the like.

Figure 9:
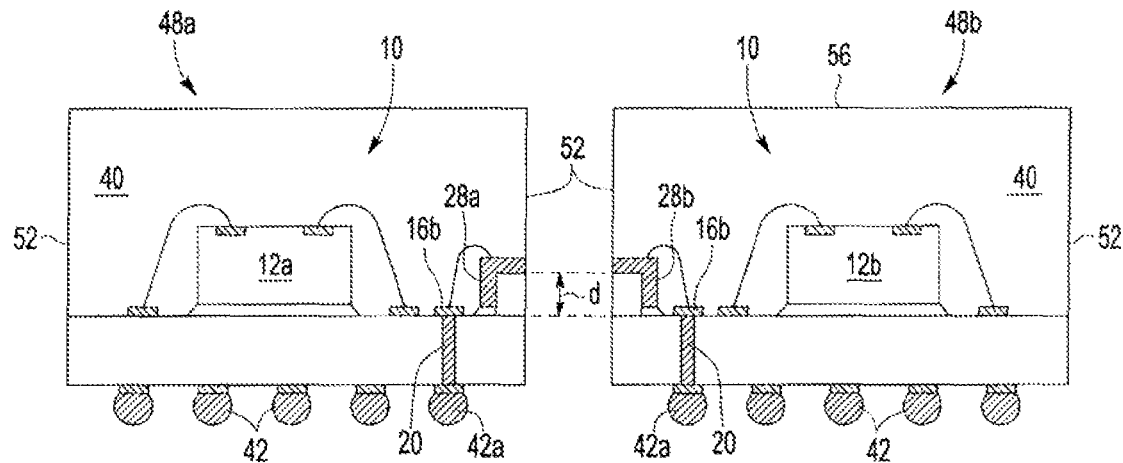
FIG. 9 is a cross-sectional, side view of the semiconductor device panel of FIG. 8, at a subsequent process step showing the singulated encapsulated device packages.

Once completed, the encapsulated device panel 10 can then be cut, sawn or otherwise singulated along a saw street 46, as illustrated in FIGS. 8 and 9, to form individual, encapsulated device packages 48a, 48b. The saw street 46 is positioned between the dies 12a, 12b and their corresponding package areas. The singulation process cuts through the encapsulant 40, the conductive component 28, and the substrate panel 14. As shown in FIG. 9, each singulated, encapsulated device package 48a, 48b includes a section 28a, 28b of the conductive component 28, which is exposed along a lateral side 52 of each of the device packages. As indicated previously, section 28a, 28b corresponds to a cross-section of the bridging area 30. Singulation can be performed using mechanical sawing, laser ablation, and the like.

As illustrated in FIG. 10, a conductive shielding material is then applied to top and side exterior surfaces of the package body to form a conformal EMI and/or RFI shield coating 54. The shield coating 54 is formed from an electrically conductive material and substantially surrounds the top and portions of the side surfaces of the encapsulated package 48b to provide protection against EM and/or RF interference from external sources, and/or to prevent the encapsulated device package 48b from producing EM and/or RF interference that may compromise the performance of other components of a system.

According to the invention, the outer surface 56 of the encapsulant 40 of the device package 48b including the exposed terminal end 50 of the conductive component 28b is coated with the conductive shielding material 54, as illustrated in FIG. 10. As such, the conductive component 28b is electrically connected directly to the conductive shield layer 54. The conductive component 28b is also connected to a ground contact pad 16b on the substrate panel 14 through wire bond 38b. As illustrated, in an embodiment, the ground contact pad 16b is, in turn, connected to a ground contact 42a (e.g., solder bump) or other grounding element, through an electrical interconnect 20 within the substrate panel 14.

In a MAPBGA package, for example, traces and contacts of plating buses may be exposed at the edge of the substrate panel 14 along the lateral sides 52 of the singulated device package 48b. Positioning the bridging section 30 such that the terminal end 50 of the conductive component 28b is elevated above the surface 18 of the substrate panel, provides a clearance between the conductive shield 54 over the terminal end 50 and exposed traces and contacts in the substrate panel 14 to avoid shorting of the electrical components.

In use, the external contacts 42, 42a can be mounted on a PCB (not shown), for example, and electrically connected to a ground voltage provided by the PCB. The connection between the conductive component 28b, the contact pad 16b, the electrical interconnect 20 and the ground electrical contact 42a, provides an electrical pathway to ground electromagnetic and/or radiofrequency energy incident upon the shielding layer 54.

The conductive shielding layer 54 can be formed from a conductive polymer, metal, metal alloy (e.g., ferromagnetic or ferroelectric material), or other suitable electrically conductive material. For example, in embodiments, the conductive shielding material can be formed from aluminum (Al), copper (Cu), stainless steel, chromium (Cr), tin (Sn), gold (Au), silver (Ag), nickel (Ni), zinc (Zn), or other metal, or a conductive polymer such as electrically conductive particle filled polymeric resin or RFI/EMI shielding polymers (e.g., Ag or Ni filled epoxy or urethane), or combinations thereof. In embodiments, the conductive shield 54 can be multi-layered.

In an embodiment, the conductive shielding layer 54 can be applied as a conformal coating over a portion of the singulated device package 48b. The conductive shielding material can be formed over the surface of 56 the encapsulant 40, for example, by physical vapor deposition (PVD), chemical vapor deposition (CVD), atomic layer deposition (ALD), electrolytic plating, electroless plating, spraying, vacuum metallization, printing, painting, lamination, and dipping, among other processes. The thickness of the conductive shielding layer 54 depends, at least in part, on the desired shielding effect. In an embodiment, the conductive shielding layer 54 can have a thickness of about 2-200 microns.

Figure 11:
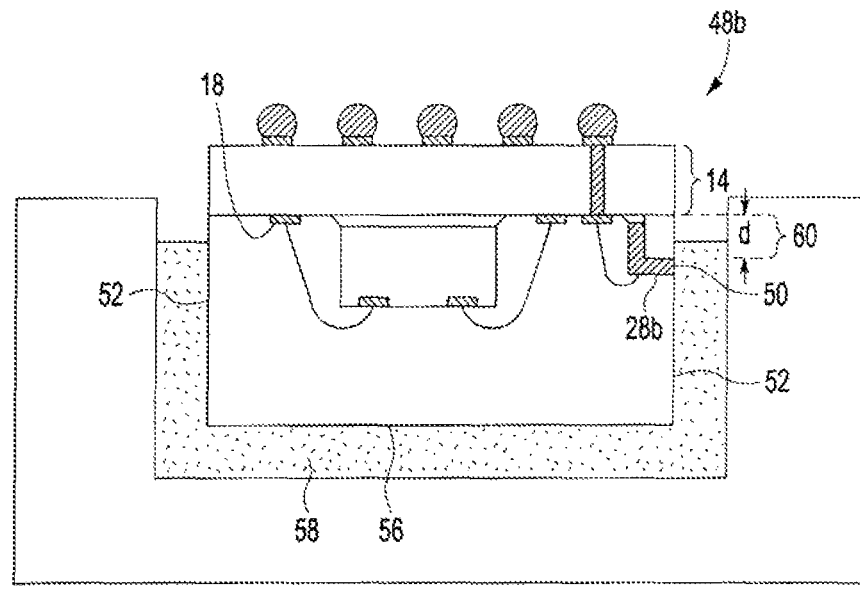
FIG. 11 is a cross-sectional, side view of a device package undergoing a step of applying a conductive shielding layer over the device package, in accordance with an embodiment.

For example, referring to FIG. 11, a conformal shielding layer can be applied utilizing a bath 58 of a conductive liquid (e.g., a conductive polymer, paint, ink, molten metal, or metal particle-containing liquid). For example, in an embodiment, the encapsulated device package 48b can be partially immersed in a bath 58 containing a conductive polymer to coat portions of the surface 56 of the package including the top surface (shown facing down in FIG. 11), and portions of the side surfaces that include the terminal end 50 of the conductive component 28b (but not the substrate panel 14). The coated package can then be exposed to infrared light, ultraviolet light or heat to cure the conductive polymer shield coating 54 on the package.

In another embodiment, a conformal metal layer can be plated onto the outer surface 56 of the device package 48b by a conventional electroplating or electroless plating process. A thin seed layer (not shown) can first be deposited onto the surface 56 of the device package by CVD, PVD, or a plating process. Then, as shown in FIG. 11, the device package 48b can be inverted and dipped in a bath 58 containing an aqueous solution of a metal salt. The package 486b is immersed in the bath to a level up to and covering the terminal end 50 of the conductive component 28b. A current is then applied to the bath 58 to reduce the metal ions and deposit a metal layer onto the seed layer (not shown) to form the conductive shielding layer 54, as shown in FIG. 10. The device package remains immersed in the solution bath 58 with the current applied until the desired thickness of the shielding layer 54 is obtained.

In another embodiment of a plating system, an electroless plating process can be used to deposit a metal layer (e.g., silver, copper) over the surfaces of the encapsulated device package 48b. For example, referring again to FIG. 11, the encapsulated device package 48b can be immersed in a bath 58 comprising an aqueous solution of a metal salt and a chemical reducing agent (e.g., potassium hypophosphite, formaldehyde, potassium borohydride, hydrazine, ascorbic acid) reacts with the metal ions to deposit a metal layer onto a seed layer to a desired thickness.

In the illustrated embodiment in FIG. 11, the terminal end 50 of the conductive component 28b is situated at a distance (d) from the surface 18 of the substrate 14. The substrate panel 14 and at least a portion of the section of encapsulant 60 between the terminal end 50 and the substrate panel are not immersed in the bath 58, and are left uncoated to avoid shorting the terminal end 50 with electrical components in or on the substrate panel 14. In an embodiment, to prevent application of the shield material onto the substrate panel 14, the substrate panel 14 and at least a portion of the section of encapsulant 60 can be covered by an appropriate removable masking material (not shown). The masking material can be applied, for example, by spraying the material onto the substrate panel 14 and a portion of section 60, for example through a patterned mask, by dipping the substrate panel 14 and section 60 into a bath containing the masking material, or by application of a thick adhesive tape.

Figure 12:
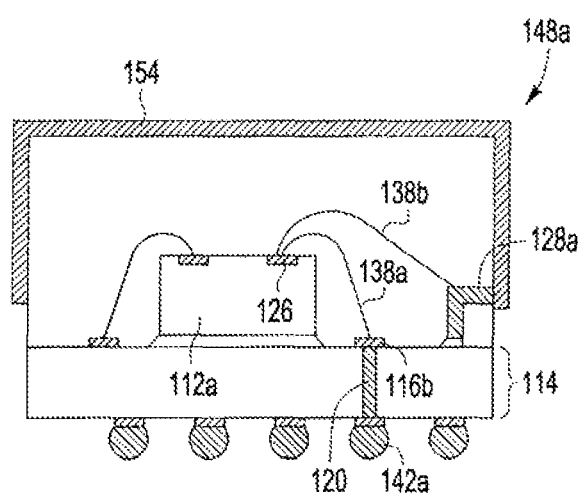
FIG. 12 is a cross-sectional, side view of semiconductor device package according to another embodiment the invention.

Referring now to FIG. 12, another embodiment of device package 148a is illustrated in which the conductive component 128a is connected through a wire bond 138b to a contact pad 126 on a die 112a. The contact pad 126 is, in turn, connected through a wire bond 138a to a ground contact pad 116b on the substrate panel 114. As shown, the ground contact pad 116b can be connected through an interconnect 120 extending through the substrate panel 114 to an external ground contact 142a (e.g., ball contact on bump).

Figure 13:
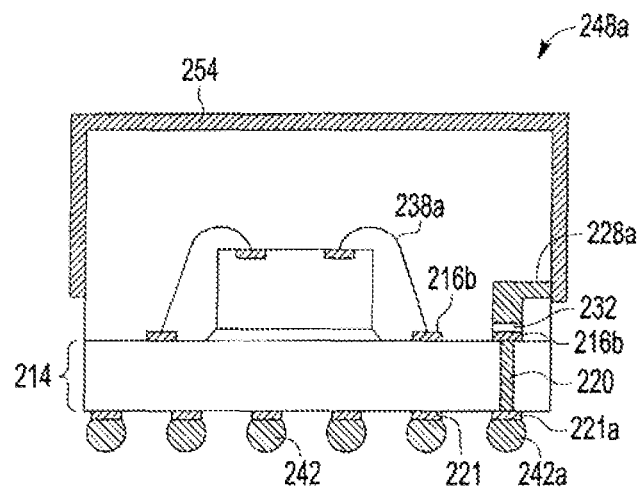
FIG. 13 is a cross-sectional, side view of a semiconductor device package according to yet another embodiment the invention.

FIG. 13 illustrates another embodiment of device package 248a in which the conductive component 228a is grounded through a conductive bonding material 232 that is applied to the substrate panel onto a conductive interconnect (via) 220 or onto a pad 216b connected to the conductive interconnect. The interconnect 220 extends through the substrate panel 214 to a ground contact pad 221a on which an external ground contact 242a is mounted on an opposing side of the substrate panel. The conductive bonding material 232 can be, for example, solder, a conductive polymer material (e.g., a silver filled epoxy), or another suitable material.

Figure 14:
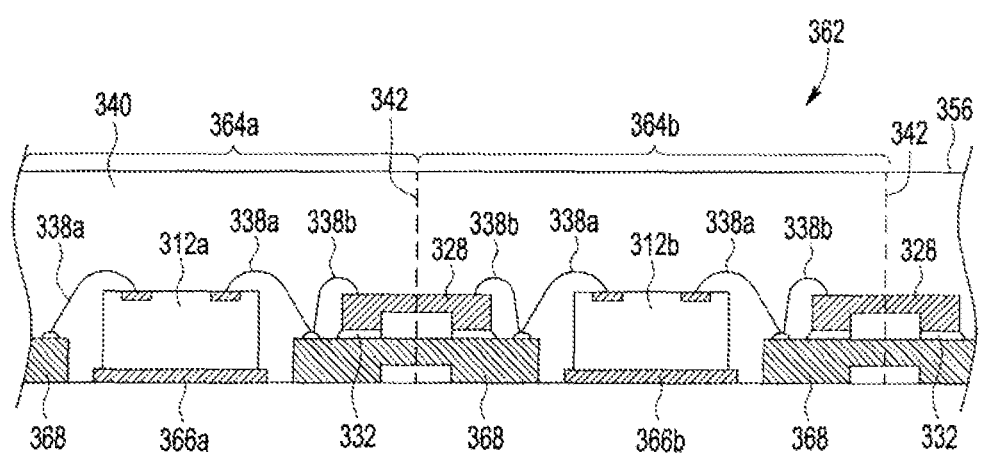
FIG. 14 is a cross-sectional, side view of a partially-formed semiconductor device panel prior to singulation according to another embodiment of the invention.

In another embodiment, the inventive subject matter may be implemented in a flat no-leads device package such as a quad-flat no-leads (QFN) package or a dual-flat no-leads (DFN) package, incorporating a conductive component attached to and grounded by a lead of the package. FIG. 14 depicts an embodiment of a device panel 362 composed of a plurality of leadframe modules 364a, 364b, which will be separated into individual flat no-leads device packages (e.g., a QFN or DFN device package). A QFN or DFN device package typically includes a die 312a, 312b, which may be mounted on a flag 366a, 366b of each leadframe module 364a, 364b. Each leadframe module 364a, 364b also includes a plurality of leads 368 that are exposed at the bottom surface of the device panel 362 of and positioned generally around the perimeter of each device, once singulated (e.g., along two or four edges of the perimeter).

In the illustrated embodiment in FIG. 14, the leadframe panel 362 includes a plurality of flags 366a, 366b and outwardly extending leads 368, with the leads of adjoining leadframe modules 364a, 364b being connected together across the saw streets 342. A die 312a, 312b can be mounted via a bonding material (not shown) to the flags 366a, 366b, respectively. In other embodiments, the dies 312a, 312b are adhered to a process supporting tape during assembly, and the flags 366a, 366b may be excluded. Each die is connected by bonding wires 338a to the leads 368 of the leadframe panel. According to an embodiment, a conductive component 328 can be mounted via a bonding material 332 on a lead 368 of each of the leadframe modules 364a, 364b. For example, the bonding material 332 may be non-conductive, and the conductive component 328 may be electrically connected by a bonding wire 338b to a lead 368, which in turn may be connected to ground when the singulated device is incorporated into a larger electrical system. Alternatively, the bonding material 332 may be conductive (e.g., solder or a conductive epoxy), and bonding wire 338b may be excluded. As shown in FIG. 14, the dies 312a, 312b, leads 368 and conductive components 328 are then encapsulated with a molding compound 340. The encapsulated leadframe panel 362 can then be cut, sawn or otherwise singulated along saw streets 342. The singulation process cuts through the encapsulant 340, the conductive components 328, and the leads 368 between adjoining leadframe modules 364a, 364b.

Figure 15:
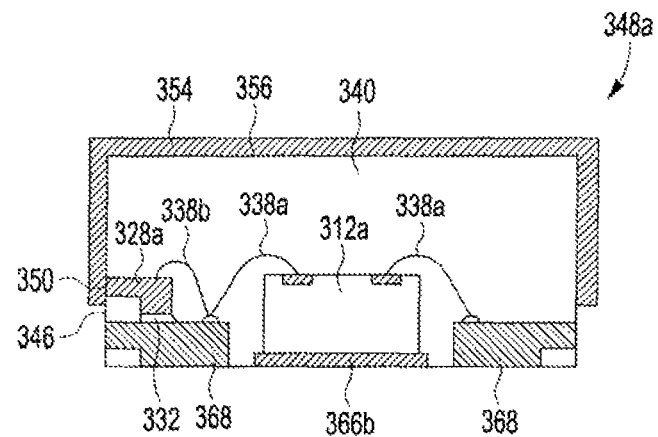
FIG. 15 is a cross-sectional, side view of a singulated one of the semiconductor devices of FIG. 14, at a subsequent process step showing application of a conductive shielding layer over the device package.

As shown in FIG. 15, a singulated, device package 348a includes the leads 368 and a section 328a of the conductive component, which are exposed along a lateral side 346 of the device package. The surface 356 of the device package 348a and the exposed terminal ends 350 of the conductive component 328a, but not the leads 368, can then be coated with a conductive shield layer 354, as described herein.

As mentioned above, in embodiments in which the conductive component 328 is mounted using a conductive bonding material 332, bonding wires 338b can be eliminated. In such an embodiment, the shielding layer 354 may be electrically coupled to the PCB ground through the conductive component 328a, the bonding wire 338b (or conductive bonding material 332), and the lead 368.

In another embodiment, the inventive subject matter may be embodied in an encapsulated device package in the form of a fan out wafer level package (FO-WLP), which incorporates conductive components and bears a conductive shield coating over the surface of the package. A FO-WLP may be implemented without wire bonding, and using die contact pads and conductive structures in one or more dielectric layers to electrically couple a die to device contacts. In general, in a FO-WLP, multiple die are encapsulated together in a panel, and routing of signals, power, and ground are provided in conductive and dielectric layers that are built directly on the panel.

Figure 16:
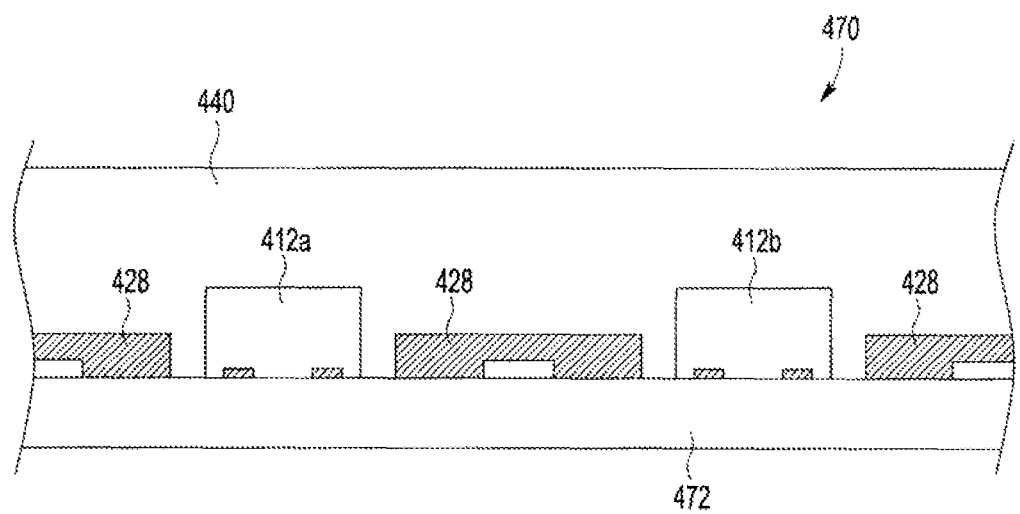
FIG. 16 is a cross-sectional, side view of a partially-formed semiconductor device panel according to yet another embodiment of the invention.

Referring to FIG. 16 in forming a FO-WLP package according to an embodiment, a device panel 470 can be created by temporarily attaching dies 412a, 412b (contact side down) and conductive components 428 to a first (temporary) substrate 472, with the conductive components 428 situated between the dies 412a, 412b, and extending between adjacent package areas. The dies 412a, 412b and conductive components 428 can be encapsulated in a molding compound 440 and the temporary substrate 472 removed.

Figure 17:
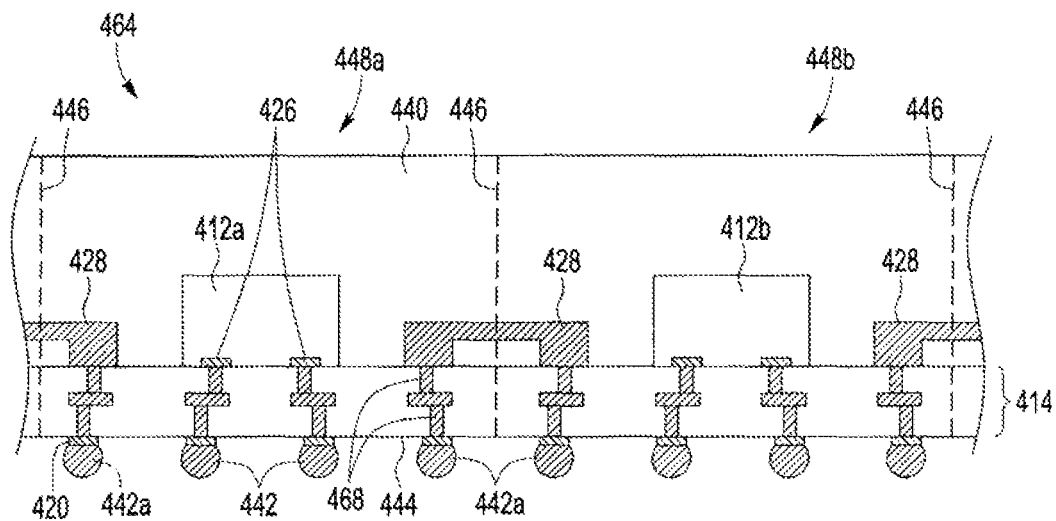
FIG. 17 is a cross-sectional, elevational view of the semiconductor device panel of FIG. 16, at a subsequent process step showing additional package layers and saw streets.
Figure 18:
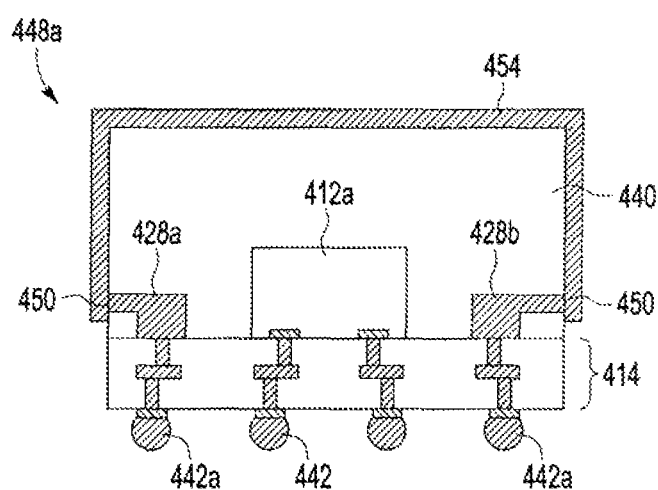
FIG. 18 is a cross-sectional, side view of one of the semiconductor devices of FIG. 17 after singulation, and at a subsequent process step showing application of a conductive shielding layer over the singulated encapsulated device package.

As depicted in FIG. 17, one or more signal, power and ground planes can then be formed on the surface of the panel 464 at which the contacts of the dies 412a, 412b and conductive components 428 are exposed. The process comprises forming a multilayer substrate panel 414 by deposition of a plurality of electrically conductive layers and insulation layers, where the conductive layers are patterned to form routing traces. The conductive components 428 and contact pads 426 on the dies 412a, 412b are electrically connected to the surface 444 of the substrate 414 through the routing traces in the conductive layer(s) and conductive vias (interconnects) 468 extending through the insulation layers of the substrate 414 to contact pads 420 at the exposed surface 444 of the substrate panel 414. External contacts 442 can then be formed, including ground contacts 442a which are electrically connected to the conductive components 428 through pads 420, vias 468, and conductive routing in the patterned conductive layer(s) of the substrate 414. The panel 464 can then be singulated along saw streets 446 to form individual device packages 448a, 448b. Referring to FIG. 18, a conductive shield layer 454 can then be applied as described herein to cover the terminal ends of the conductive components 428a, 428b exposed at the lateral sides of the singulated device package 448a.

It should be appreciated that the detailed description is intended to encompass numerous embodiments. For example, the various embodiments relate to encapsulated semiconductor device packages, each including one or more semiconductor die and a conductive component coupled to a substrate, an encapsulant surrounding the die and the conductive component except for an end of the conductive component at a lateral side of the package, and a conductive shield layer overlying the encapsulant and the exposed end of the conductive component. In embodiments, the conductive shield layer overlies the conductive component and is distanced from a surface of the substrate. In embodiments, the conductive component within the singulated device package has a partial arch shape. In embodiments, the conductive component is a pre-formed element. In embodiments, the conductive component is coupled to the substrate with a conductive bonding material. In embodiments, the conductive component is electrically coupled through one or more conductive vias extending through the substrate to a ground contact pad on an opposing side of the substrate. In other embodiments, the conductive component is formed in-situ on the substrate. In embodiments, the conductive component is wire bonded to a ground contact pad on the substrate. In other embodiments, the conductive component is wire bonded to a contact pad on the die, and the contact pad on the die is wire bonded to a ground contact pad on the substrate. In embodiments, the conductive component is mounted on and electrically coupled to a lead of a leadframe. In embodiments, the device package is a BGA package, a flat no-leads device package, or a FO-WLP package. In embodiments, the conductive shield layer is at least one of an electromagnetic interference shield and a radio frequency shield.

Other embodiments include methods of making a packaged semiconductor device, which includes providing a substrate panel having a plurality of dies thereon, providing a conductive component between two adjacent dies, encapsulating the plurality of dies and the conductive component, singulating the resulting panel to form individual device packages which includes cutting through the conductive component between the two adjacent dies such that that each singulated device package contains at least one die and a portion of the conductive component with an end of the conductive component exposed along a lateral side of the device package, and forming a conductive shield layer over the encapsulant of the device package including the exposed end of the conductive component. In embodiments, the conductive shield layer covers the exposed end of the conductive component and is distanced from a surface of the substrate panel. In embodiments, prior to singulation, the conductive component between the two adjacent dies is arch shaped with a bridging section extending between the package areas corresponding to each of the dies. In embodiments, providing the conductive component comprises mounting a pre-formed conductive component on the substrate panel between the two adjacent dies. In embodiments, the conductive component is mounted by a conductive bonding material and is electrically coupled to a conductive via extending through the substrate panel to a ground contact pad on an opposing side of the substrate panel. In embodiments, the method further includes wire bonding the conductive component to a ground contact pad on the substrate. In embodiments, the method further includes wire bonding the conductive component to a contact pad on each of the two adjacent dies, and wire bonding each of the contact pads of each of the two adjacent dies to separate ground contact pads on the substrate panel. In embodiments, providing the conductive component comprises mounting a pre-formed conductive component on a lead of a leadframe, and wire bonding the conductive component to a lead of the leadframe. In embodiments, forming the conductive shield layer comprises immersing the singulated device package including the exposed end of the conductive component in a conductive polymer or plating solution such that the substrate is left uncoated. In embodiments, the singulated device package is immersed in a plating or polymer solution such that the substrate and a section between the exposed terminal end and the substrate are left uncoated.

The terms "top," "bottom," "over," "under," "overlying," "underlying," and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The terms "a" or "an," as used herein, are defined as one or more than one. Also, the use of introductory phrases such as "at least one," "at least two," and "one or more" in the claims should not be construed to imply that the introduction of another claim element by the indefinite articles "a" or "an" limits any particular claim containing such introduced claim element to devices, etc., containing only one such element, even when the same claim includes the introductory phrases "one or more" or "at least one" and indefinite articles such as "a" or "an." The same applies to the use of definite articles.

Although the description refers to specific embodiments, various modifications and changes can be made without departing from the scope of the inventive subject matter as set forth in the claims below. Accordingly, the specification and figures are to be regarded in an illustrative rather than a restrictive sense, and all such modifications are intended to be included within the scope of the inventive subject matter. Any benefits, advantages, or solutions to problems that are described herein with regard to specific embodiments are not intended to be construed as a critical, required or essential feature or element of any or all of the claims.

What is claimed:

1. A method of making a semiconductor device package, the method comprising:

providing a substrate panel having a plurality of dies coupled on and directly to a top surface of the substrate panel on adjacent package areas of the substrate panel;

providing a conductive component coupled on and directly to said top surface of the substrate panel, the conductive component spanning the adjacent package areas, the conductive component having a rigid structure in an arched or block configuration and coupled to a ground element;

wherein the plurality of dies and the conductive component are coupled to a common surface of the substrate panel;

applying an encapsulant over and in direct contact with the plurality of dies and the conductive component to produce a device panel;

singulating the encapsulated device panel to provide separate, individual device packages having a top surface and lateral side surfaces, wherein said singulating includes cutting through the encapsulant, the conductive component between the adjacent package areas and the substrate panel such that each device package contains at least one die and a portion of the conductive component with an end of the conductive component exposed along a lateral side surface of the device package and distanced from said top surface of the substrate panel; and applying a conductive shield material onto the singulated device package to form a layer as a conformal coating over and in contact with the top surface and the lateral side surfaces of the encapsulated and singulated device package including the exposed end of the conductive component;

wherein the conductive shield layer is in contact with the exposed end of the conductive component but not with the substrate panel, and a portion of the lateral side surface of the encapsulated device package between the exposed end of the conductive component and said top surface of the substrate panel is not covered by the conductive shield layer such that the conductive shield layer is distanced from said top surface of the substrate panel.

2. The method of claim 1, wherein the conductive component between the adjacent package areas is arch shaped with a bridging section extending between the adjacent package areas.

3. The method of claim 1, wherein providing the conductive component comprises mounting a pre-formed conductive component on the substrate panel between the dies.

4. The method of claim 1 wherein the conductive component has a width of at least 25 microns to 500 microns, and a length of at least 300 microns to 5000 microns.

5. The method of claim 1, wherein the end of the conductive shield layer is separated from a surface of the substrate by a distance, and the distance between the conductive shield layer and the surface of the substrate is in a range of 5 microns to 250 microns.

6. The method of claim 1, wherein the conductive component of the individual device package has a partial arch shape.

7. The method of claim 1, further comprising coupling the conductive component as a pre-formed element to the substrate.

8. The method of claim 1, further comprising coupling the conductive component to the substrate with a conductive bonding material.

9. The method of claim 1, further comprising fabricating the conductive component in-situ on the substrate.

10. The method of claim 1, wherein the conductive component is mounted on a lead of a leadframe.

11. The method of claim 1, wherein the device package is selected from a ball grid array package, a flat no-leads device package, and a fan out wafer level package.

12. The method of claim 1, wherein the conductive shield layer is at least one of an electromagnetic interference shield and a radio frequency shield.

13. The method of claim 9, wherein fabricating the conductive component in situ is by a process selected from the group consisting of a deposition process, an electroplating process, a lamination technique, and a printing process.

14. A method of making a semiconductor device package, the method comprising:

providing a substrate panel having a plurality of dies coupled on and directly to a top surface of the substrate panel on adjacent package areas of the substrate panel;

providing a conductive component coupled on and directly to said top surface of the substrate panel, the conductive component spanning the adjacent package areas, the conductive component having a rigid structure in an arched or block configuration and coupled to a ground element;

wherein the plurality of dies and the conductive component are coupled to a common surface of the substrate panel;

applying an encapsulant over and in direct contact with the plurality of dies and the conductive component to produce a device panel;

singulating the encapsulated device panel to provide separate, individual device packages having a top surface and lateral side surfaces, wherein said singulating includes cutting through the encapsulant, the conductive component between the adjacent package areas and the substrate panel such that each device package contains at least one die and a portion of the conductive component with an end of the conductive component exposed along a lateral side surface of the device package and distanced from said top surface of the substrate panel; and applying a conductive shield material onto the singulated device package to form a conductive shield layer as a conformal coating over and in contact with the top surface and the lateral side surfaces of the encapsulated and singulated device package including the exposed end of the conductive component;

wherein forming the conductive shield layer comprises immersing the package including the exposed end of the conductive component in a plating or polymer solution such that the substrate and the portion of the lateral side surface between the exposed end of the conductive component and said top surface of the substrate panel are left uncoated; and wherein the conductive shield layer is in contact with the exposed end of the conductive component but not with the substrate panel, and a portion of the lateral side surface of the encapsulated device package between the exposed end of the conductive component and said top surface of the substrate panel is not covered by the conductive shield layer such that the conductive shield layer is distanced from said top surface of the substrate panel.

15. A method of making a semiconductor device package, the method comprising:

providing a device panel having a plurality of dies and a conductive component encapsulated within an encapsulant, wherein the conductive component and contact pads of the plurality of dies are exposed at a first surface of the encapsulant, and the conductive component has a rigid structure in an arched or block configuration and extends across a saw street between adjacent package areas;

forming a substrate panel composed of a plurality of conductive and insulating layers over the first surface of the encapsulant, wherein the plurality of conductive and insulating layers electrically couple the contact pads and the conductive component with conductive interconnects at a top surface of the substrate panel, and the conductive component is on and in direct contact with the top surface of the substrate panel;

singulating the device panel and substrate panel to provide individual device packages having a top surface and lateral side surfaces, wherein said singulating includes cutting through the encapsulant and the conductive component between the adjacent package areas such that each device package contains at least one die and a portion of the conductive component with an end of the conductive component exposed along a lateral side surface of the device package and distanced from the top surface of the substrate panel; and applying a conductive shield material onto the singulated device package to form a layer as a conformal coating over and in contact with the top surface and the lateral side surfaces of the device package;

wherein the conductive shield layer is in contact with the exposed end of the conductive component but not with the substrate panel, and a portion of the lateral side surface of the device package between the exposed end of the conductive component and the top surface of the substrate is not covered by the conductive shield layer such that the conductive shield layer is distanced from the top surface of the substrate panel.

16. The method of claim 15, wherein the conductive component between the adjacent package areas is arch shaped with a bridging section extending between the adjacent package areas.

17. The method of claim 15 wherein the conductive component has a width of at least 25 microns to 500 microns, and a length of at least 300 microns to 5000 microns.

18. A method of making a semiconductor device package, the method comprising:

providing a device panel having a plurality of lead frame modules, a die coupled to a flange of each leadframe module, a lead exposed at a surface of the device panel and extending across a saw street between adjacent leadframe modules, the lead having a top surface, and a conductive component having a rigid structure in an arched or block configuration coupled to the lead and extending across said saw street between said adjacent lead frame modules;

encapsulating the dies, lead and conductive component with encapsulant;

singulating the device panel by cutting along the saw street through the encapsulant, the conductive component and lead to provide individual device packages such that each device package has a top surface and lateral side surfaces and contains at least one die and a portion of the conductive component with an end of the conductive component and an end of the lead exposed along a lateral side surface of the device package, and the exposed end of the conductive component is distanced from the top surface of the lead; and applying a conductive shield material onto the singulated device package to form a layer as a conformal coating over and in contact with the top surface and the lateral side surfaces of the encapsulant and the exposed end of the conductive component but not the exposed end of the lead;

wherein the conductive shield layer is in contact with the exposed end of the conductive component but not with the lead, and a portion of the lateral side surface of the device package between the exposed end of the conductive component and the top surface of the lead is not covered by the conductive shield layer such that the conductive shield layer is distanced from the top surface of the lead.

* * * * *